United States Patent
Buchaillot et al.

(10) Patent No.: US 6,947,719 B2
(45) Date of Patent: Sep. 20, 2005

(54) NANO-ELECTROMECHANICAL FILTER

(75) Inventors: Lionel Buchaillot, Lille (FR); Dominique Jules Victor Collard, Lambersart (FR)

(73) Assignee: Centre National de la Recherche Scientifique, Paris (FR)

(*) Notice: Subject to any disclaimer, the term of this patent is extended or adjusted under 35 U.S.C. 154(b) by 469 days.

(21) Appl. No.: 10/312,037

(22) PCT Filed: Jun. 29, 2001

(86) PCT No.: PCT/FR01/02087
§ 371 (c)(1),
(2), (4) Date: Dec. 23, 2002

(87) PCT Pub. No.: WO02/01717
PCT Pub. Date: Jan. 3, 2002

(65) Prior Publication Data
US 2003/0186672 A1 Oct. 2, 2003

(30) Foreign Application Priority Data
Jun. 30, 2000 (FR) .......................................... 00 08490

(51) Int. Cl.7 .............................. H04B 1/10; H03H 9/00
(52) U.S. Cl. ........................ 455/307; 455/339; 333/186
(58) Field of Search .................................. 455/280, 286, 455/307, 338, 339; 333/186, 191, 198; 708/300

(56) References Cited

U.S. PATENT DOCUMENTS 3,931,600 A * 1/1976 Nagashima et al. ........ 333/197
2002/0166218 A1 * 11/2002 Barber ....................... 29/25.35

OTHER PUBLICATIONS

K. Wang et al.: "Q-enhancement of microelectromechanical filters via low-velocity spring coupling" IEEE Ultrasonics Symposium Proceedings, pp. 323–327 Oct. 5, 1997.
M.R. Rakhshandehroo et al.: "Field emission from gates Si emitter tips with precise gate–tip spacing, gate diamer, tip sharpness, and tip protrusion" J. Vac. Sci. Technol., vol. 15, No. 6, pp. 2777–2781 Nov. 1997–Dec. 1997.
M. Geradin et al.: "Theorie des vibrations" pp. 181–188.

* cited by examiner

Primary Examiner—Nguyen T. Vo
(74) Attorney, Agent, or Firm—Oblon, Spivak, McClelland, Maier & Neustadt, P.C.

(57) ABSTRACT

A nano-electromechanical filter. The filter includes, on a substrate, at least one microtip extended by a beam-shaped nanostructure. The microtip and the nanostructure are at least superficially conductive. The nanostructure forms a resonator. At least one input electrode and at least one output electrode are formed on an insulating layer, on both sides of the axis of the microtip, in the vicinity of the apex of the microtip. The input electrode receives a signal to be filtered and the output electrode provides a filtered signal. The filter can be particularly applied to wireless communications.

7 Claims, 4 Drawing Sheets

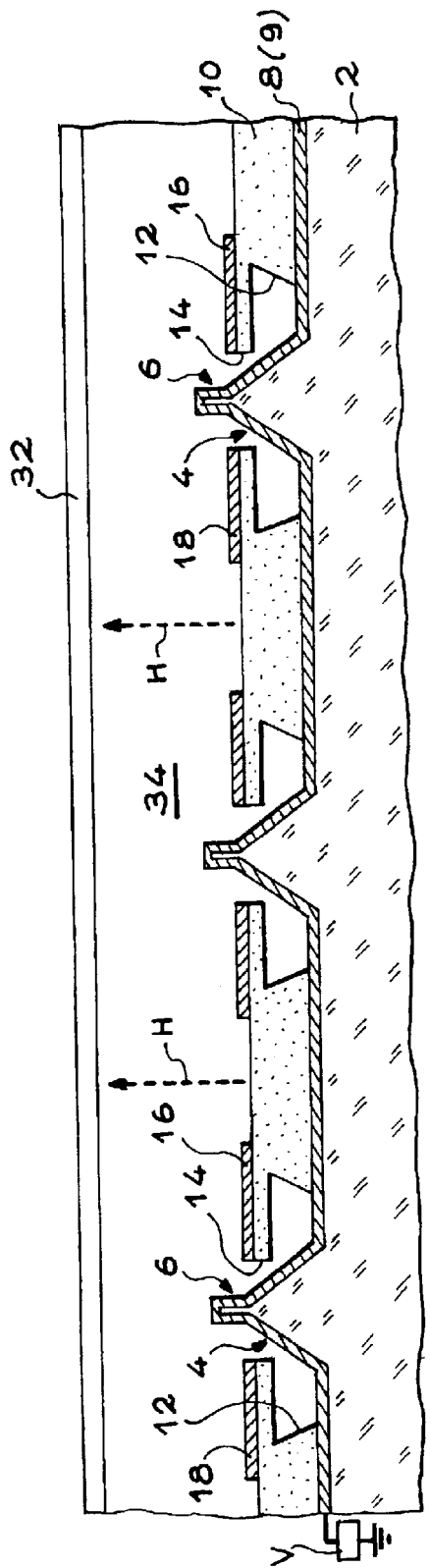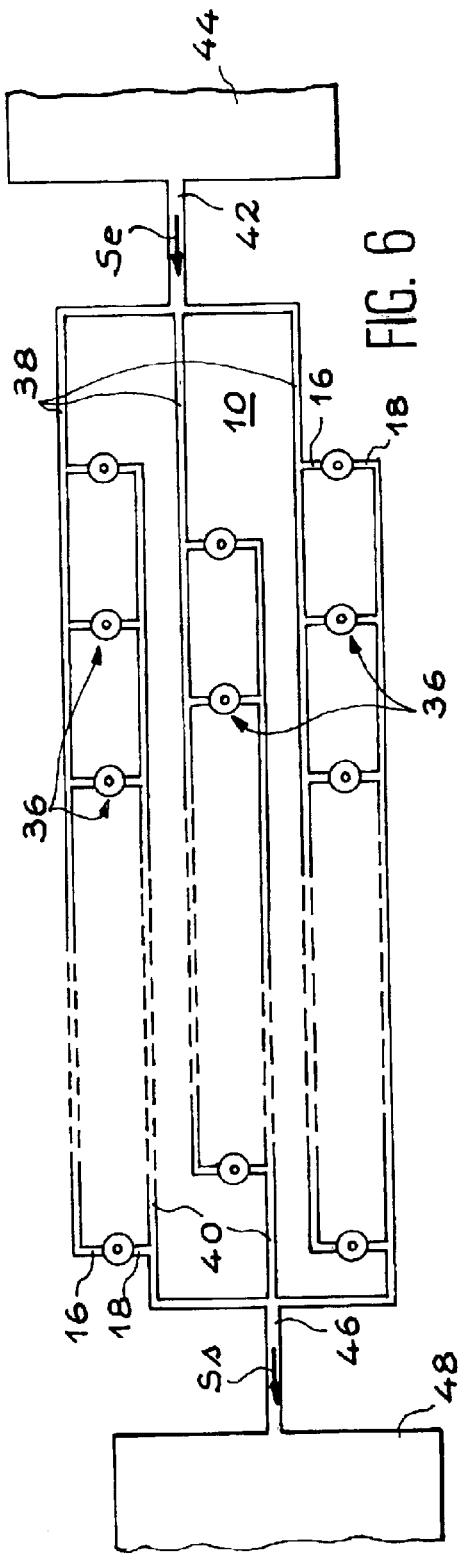

NANO-ELECTROMECHANICAL FILTER

FIELD OF THE INVENTION

The present invention relates to an electrical filter and, more particularly, to a bandpass electromechanical filter.

It is particularly applied to the field of filtering for wireless telecommunications such as mobile telephony, and to electronic diaries.

It also finds applications in the multimedia field where portable telecommunication means are used.

It also finds applications in devices which require the selection of high frequency signals, such as for example chip cards.

STATE OF THE PRIOR ART

Presently, telecommunication services have to face an continually increasing number of users. Taking into account the limits of frequency band assignment, this involves greater demands on the service providers as regards utilization of their bandwidth.

Specifications related to passbands have repercussions on the constraints of the filtering devices, which must be selective. Accordingly, this leads to improving the quality coefficient of the filters while observing the bulk constraints, constraints which are of prime importance for mobile telecommunication devices such as portable telephones and organizers, for example.

Presently, in the field of mobile telecommunications, the filtering function is achieved by surface wave filters. They are made of quartz and have good characteristics except as regards bulkiness, weight, and insertion losses in an electronic circuit.

It is possible to reduce bulkiness, weight, and insertion losses by using electromechanical filters or, more precisely, taking into account their size, micro-electromechanical filters, which are made with the same techniques as micro-electronic circuits, thus avoiding the inherent disadvantages of hybridization.

On the other hand, with the present designs of these micro-electromechanical filters, frequencies greater than 400 MHz and all the more, those frequency bands used for telecommunications and located in the vicinity of 1 GHz or higher cannot be attained.

SUMMARY OF THE INVENTION

The object of the present invention is to remedy this disadvantage by providing an electromechanical filter which uses a resonant structure of a suitable design and, more specifically, a resonant nanostructure.

Furthermore, the manufacturing cost of a filter according to the invention may be low, because of the use of collective machining techniques.

As compared with the aforementioned surface wave filters, a filter according to the invention has the advantage of being more readily insertable into an electronic circuit, as the manufacture of this filter uses the same technique as the manufacture of such a circuit and does not require a hybridization phase.

Specifically, the object of the present invention is an electromechanical filter characterized in that it comprises:
 a substrate,
 at least one microtip which is formed on the substrate and the apex of which is extended by a beam-shaped microstructure which extends along the axis of the microtip, this microtip and the nanostructure being, at least superficially, electrically conductive, the nanostructure forming an electromechanical resonator;
 an electrically insulating layer which is formed on the substrate and comprises a cavity in which the microtip is located and, substantially at the level of the apex of this microtip, a bore which extends the cavity and the edge of which surrounds this apex, and
 at least one input electrode and at least one output electrode which are formed on the insulating layer and end substantially at the edge of the bore, on both sides of the microtip, the input electrode being provided for receiving an electrical signal to be filtered and the output electrode being provided for supplying a filtered electrical signal, a coupling being created between these electrodes and the nanostructure, this coupling enabling the electromagnetic resonator to be set in resonance.

Preferably, the microtip and the nanostructure are metallized (so as to make them electrically conductive).

According to a specific embodiment of the filter according to the invention, the microtip is associated with two output electrodes, one of which is electrically connected to the input electrode.

According to a specific embodiment of the invention, the microtip and the nanostructure are coated with a layer of a magnetic metal, capable of producing a magnetic field substantially parallel to the axis of the microtip.

According to a first specific embodiment of the subject filter according to the invention, this filter comprises several microtips, provided with input electrodes, output electrodes, and nanostructures respectively which form electromechanical resonators having the same resonant frequency, the input electrodes being electrically connected to one another and the output electrodes also being electrically connected to one another.

According to a second specific embodiment, this filter comprises several microtips, provided with input electrodes, output electrodes, and nanostructures respectively which form electromechanical resonators, these microtips being distributed into a plurality of groups, the electromechanical resonators associated with the microtips of the same group having the same resonant frequency, the input electrodes being electrically connected to one another and the output electrodes associated with the microtips of the same group being electrically connected to one another.

According to a specific embodiment of the invention, each electromechanical resonator is in a space in which a vacuum has been applied.

BRIEF DESCRIPTION OF THE DRAWINGS

The present invention will be better understood upon reading the description given hereinafter of exemplary embodiments, which are given purely as indications and are by no means limiting, with reference to the accompanying drawings.

FIG. 5 is a schematic sectional view of another filter according to the invention, comprising several microtips, FIG. 6 is a schematic top view of a filter according to the invention, this filter comprising a group of elementary filters (filters comprising a single microtip), the electromechanical resonators of which all have the same resonant frequency.

DETAILED DESCRIPTION OF SPECIFIC EMBODIMENTS

An elementary filter according to the invention is a bandpass filter comprising an electromechanical resonator (a nanoresonator, taking into account its size, examples of which are given later on). It is based on the microsystem technique.

An electrical signal with a frequency greater than 400 MHz may be filtered with this elementary filter; the frequency band of this elementary bandpass filter is centered on a frequency f greater than 400 MHz and capable of reaching 1 GHz or even higher; furthermore, this band is narrow; its width may not exceed 100 kHz.

Figure 1:
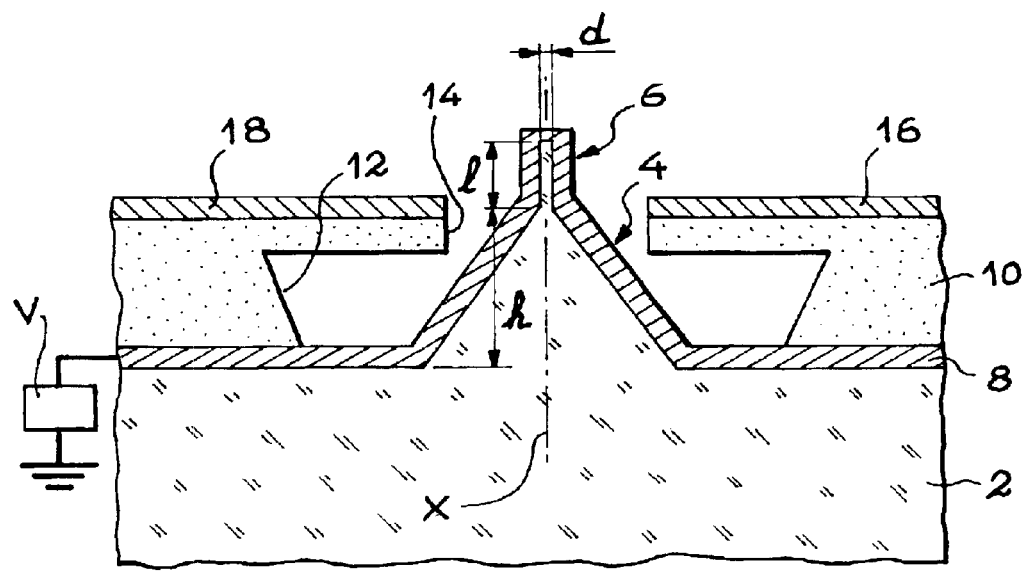
FIG. 1 is a schematic sectional view of a specific embodiment of the filter according to the invention, comprising only one microtip.

FIG. 1 is a schematic sectional view of a filter according to the invention. This concerns an elementary filter, comprising a single electromechanical nanoresonator More specifically, the elementary filter of FIG. 1 is formed on a substrate 2 and comprises a substantially conical microtip 4 formed on this substrate. The axis of this microtip is marked as X. The apex of this microtip is extended by a beam-shaped nanostructure 6, termed "nanobeam" hereinafter, which extends along the X axis.

In FIG. 1, references h, l and d designate the height of the microtip 4, the length of the nanobeam 6, and the diameter of the latter, respectively.

The elementary filter of FIG. 1 also comprises a metallic layer 8 set to an arbitrary potential V, which extends over the substrate 2, and covers the microtip 4 as well as the nanobeam 6 with which this microtip is provided. Moreover, an electrically insulating layer 10 is formed on this metallic layer 8.

A cavity 12 is formed in this insulating layer 10 and contains the microtip 4, as seen in FIG. 1. Moreover, this insulating layer 10 has a bore 14 which extends the cavity 12 and whose axis is the X axis.

This bore 14 surrounds the apex of the microtip. It may be seen that the nanobeam 6 emerges from the insulating layer 10.

It is specified that it is known how to manufacture a microtip provided with such a nanobeam, for use in the field of near field microscopy.

Figure 2:
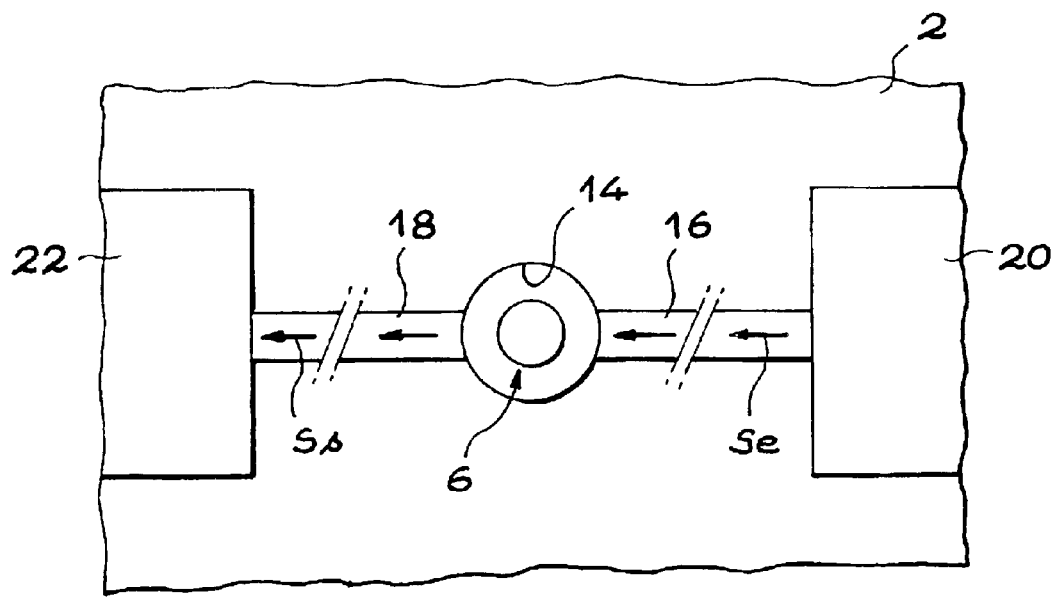
FIG. 2 is a schematic top view of the filter of FIG. 1, wherein one input electrode and one output electrode are used.

Referring to FIG. 2, which is a schematic top view of FIG. 1, it is seen that the elementary filter also comprises an input electrode 16 and an output electrode 18 which are substantially aligned and whose two respective ends are diametrically opposite on the edge of the bore 14.

It is seen in FIG. 2 that the elementary filter forms part of an electronic circuit for filtering an electrical signal generated or received in this circuit.

More specifically, this elementary filter connects a first portion 20 of the circuit to a second portion 22 thereof. Both of these portions of this circuit are formed on the same substrate 2 as the elementary filter by microelectronics' techniques, which are also used for manufacturing the filter, as will be seen further on.

By way of example, the first portion 20 of the electronic circuit is an antenna of a portable telephone and provides an electrical signal Se, or input signal, which is intended to be filtered. The second portion 22 of the circuit comprises means for amplifying and processing the filtered signal Ss, or output signal.

The input signal Se energizes the nanoresonator formed by the metallized nanobeam which filters this signal Se, only letting through the components of signal Se with frequencies belonging to the passband of the elementary filter.

This passband depends on the geometrical characteristics and on the constituent materials of the metallized microtip and nanobeam.

Purely as an indication and by no means in a limiting way, the substrate 2 and the microtip 4, as well as the associated nanobeam 6, are made of silicon; the metallization layer 8 of the microtip and of the nanobeam is made of gold or tungsten; the input electrode 16 and the output electrode 18 are also made of gold or tungsten; the insulating layer 10 is made of silica or silicon nitride, or an electrically insulating polymer; the ratio h/l is approximately 10, and the diameter d is approximately l/10, h being of the order of 1 micrometer to 4 micrometers.

Figure 3:
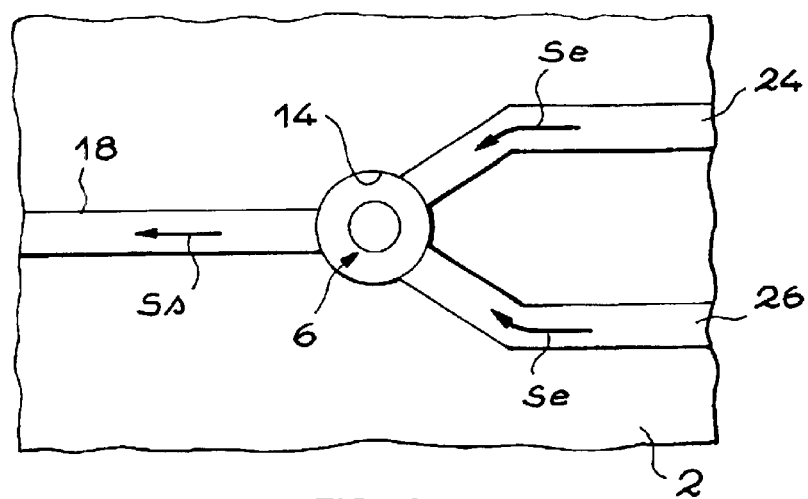
FIG. 3 is a schematic top view of another filter according to the invention, wherein two input electrodes and one output electrode are used.

The embodiment of the elementary filter which is schematically illustrated in a top view in FIG. 3 is distinct from that of FIG. 2 in that it comprises two input electrodes 24 and 26 instead of a single one.

As it is seen, both of these input electrodes have ends substantially on the edge of the bore 14, on one side of the latter, whereas the output electrode 18 has one end at the edge of this bore 14, substantially opposite the respective ends of the input electrodes 24 and 26.

The latter both receive the signal Se which is intended to be filtered and they thus form a larger energizing source of the nanoresonator than in the case of FIG. 2, where a single input electrode is provided.

Figure 4:
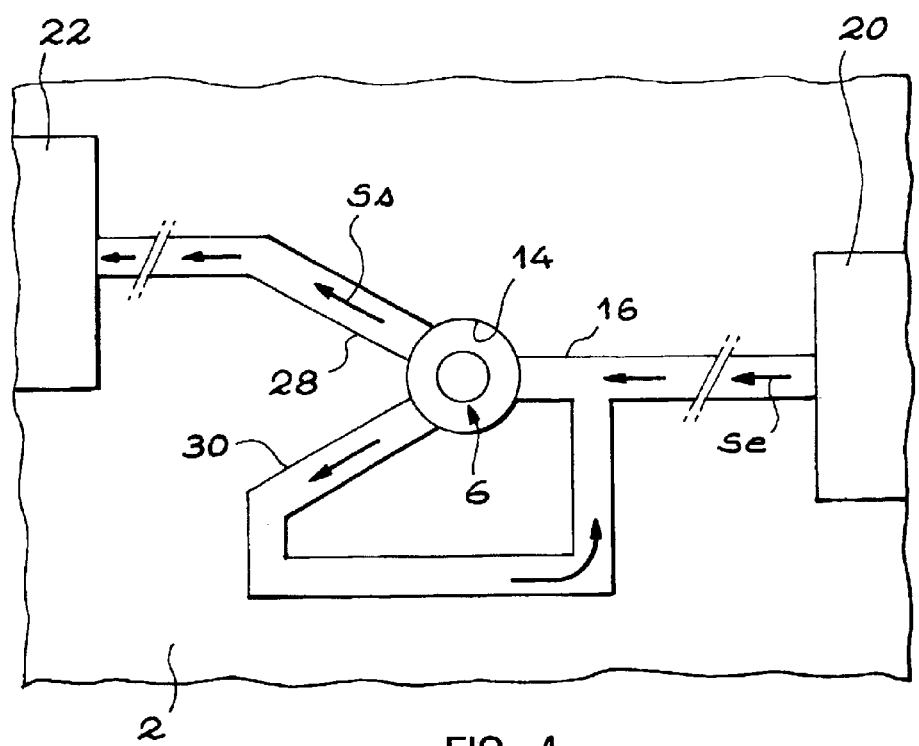
FIG. 4 is a schematic top view of another filter according to the invention, wherein one input electrode and two output electrodes are used.

The elementary filter according to the invention, of which FIG. 4 is a schematic top view, differs from the one in FIG. 2 in that it comprises two output electrodes 28 and 30 instead of a single one.

The respective ends of these output electrodes are again located at the edge of the bore 14, substantially opposite the end of the input electrode 16 which is also found on the edge, as seen in FIG. 4.

One 28 of these output electrodes collects a portion of the filtered signal Ss in order to forward it to the amplifying and processing circuit 22 as earlier, whereas the other output electrode 30 collects a portion of this filtered signal Ss in order for closed loop control of the filter: as it is seen, this other output electrode 30 substantially forms a loop which is connected to the input electrode 16.

With this closed loop control, control of the filter may be enhanced.

In a specific embodiment not shown, two output electrodes are again used, but there is no closed loop control; both of these electrodes are connected to a circuit for amplifying and processing the output signal Ss.

To increase the current available at the output of a bandpass filter according to the invention, this filter preferably contains several elementary filters (each comprising a single nanoresonator).

This is illustrated by FIG. 5, which is a schematic sectional view of a filter according to the invention.

This filter comprises, on the substrate 2, several microtips 4 surmounted by nanobeams 6 respectively. These microtips and the corresponding nanobeams are again metallized with the conductive layer 8 which extends over the substrate 2 and which is set at an arbitrary potential V.

Alternatively, the microtips are not all at the same potential: they are polarized individually or in groups, the microtips of the same group being at the same potential.

Returning to FIG. 5, each microtip 4 is again housed in a cavity formed in an electrically insulating layer 10 which extends over the substrate 10 above the layer 8, and the bores 14 of the insulating layer 10 are seen from which the nanobeams 6 emerge.

Three microtips 4 are shown in FIG. 5 but in practice it is possible to form several hundred microtips and therefore several hundred elementary filters on the substrate 2.

An input electrode 16 and an output electrode 18 are seen in FIG. 5 on both sides of each microtip. These electrodes extend perpendicularly to the plane of FIG. 5.

To improve the operation of a filter according to the invention, particularly the filter of FIG. 5, it is possible to provide a sealed cover 32 which confines this filter. The edge (not shown) of this cover is hermetically sealed to the edge of the substrate 2 on which the filter and the associated electronic circuits were formed. Moreover, a vacuum is applied in the space 34 between this cover and the substrate. The manufacture of a filter according to the invention is explained in the following.

To start with, the microtip, or in practice the microtips, are formed on the substrate. The nanobeams are then formed. For the manufacture of the microtips, reference will be made for example to the following document:

Rakhshanderoo, M. R., and Pang, S. W., J. Vac. Sci. Technol. B 15(6) 2777 (1997).

These microtips, surrounded by the electrically insulating layer, are of the kind as those used in field emission cathodes. However, in the present invention, to obtain the nanoresonators, it is necessary to thin down the respective ends of the microtips to form the nanobeams.

After having formed the microtips provided with the corresponding nanobeams, these microtips and nanobeams are metallized and on the thereby metallized substrate 2, the electrically insulating layer 10 or sacrificial layer is then formed.

The latter is etched so as to provide cavities and bores 14 at the level of the different microtips.

For example, if the sacrificial layer 12 is made of silica, reactive ion etching is used to form these cavities and bores.

The electrodes 16 and 18 are then formed on the thereby etched layer 12.

FIG. 6 is a schematic top view of another filter according to the invention, comprising a large number of identical elementary filters 36 and therefore a large number of elementary electromechanical resonators.

In the example of FIG. 6, all of these nanoresonators therefore have the same resonant frequency. Moreover, various electrically conductive strips 38 and 40 are seen in FIG. 6, formed on the surface of the insulating layer of the filter for connecting the various elementary filters 36 forming this filter.

It is seen that the filter of FIG. 6 comprises several rows of elementary filters and, in each row, all the input electrodes 16 are connected to each other via a conductive strip 38, or input conductive strip.

Likewise, in each row, all the output electrodes 18 are connected to each other via another conductive strip 40, or output conductive strip.

The input conductive strips 38 are connected to each other and also to a conductive strip 42 which itself is connected to a portion 44 of an electronic circuit for providing the electrical signal Se which is to be filtered.

Likewise, the output conductive strips 40 are connected to each other and also to a conductive strip 46 which itself is connected to another portion 48 of the electronic circuit for amplifying and processing the filtered signal Ss.

Figure 7:
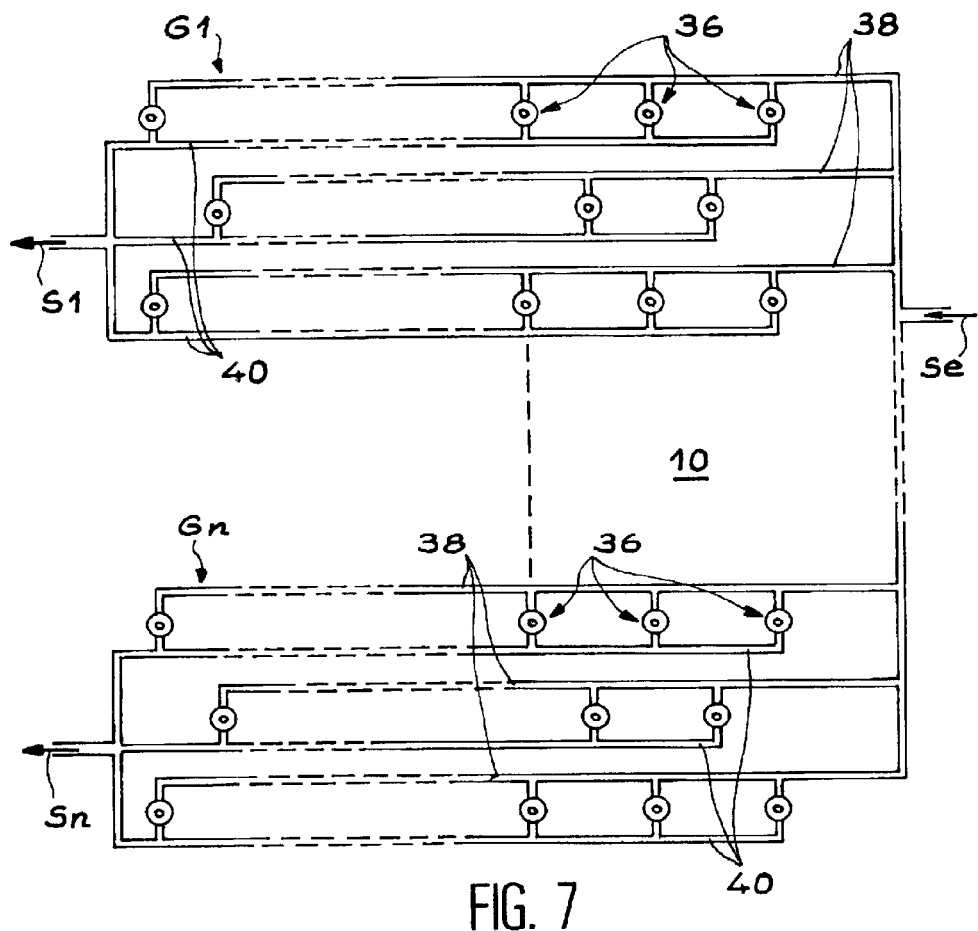
FIG. 7 is a schematic top view of another filter according to the invention, this filter comprising several groups of elementary filters, the electromechanical resonators of a same group having the same resonant frequency.

FIG. 7 is a schematic top view of another filter according to the invention comprising n groups, G1–Gn, of elementary filters, with $n \geq 2$.

In each group, the nanoresonators all have the same resonant frequency: the nanoresonators of the first group G1 thus have the same resonant frequency F1, etc., and the n-th group Gn has a resonant frequency Fn.

These resonant frequencies F1–Fn are different from one another.

In the example of FIG. 7, each group has the configuration of the set of elementary filters of FIG. 6.

In this example of FIG. 7, there is thus the same arrangement of conductive strips in each group as in the case of FIG. 6.

It is specified that the input conductive strips 38 are all connected to each other so that they all receive the input electrical signals Se which are intended to be filtered.

The output conductive strips 40 of a same group are connected to each other in order to provide an output signal; groups G1–Gn provide output signals S1–Sn respectively.

Each group of elementary filters forms a bandpass filter which only lets through the signals with frequencies within a determined frequency band centered on frequency F1 for the first group G1 and on frequency Fn for the n-th group Gn.

Each output signal may then be processed by an electronic circuit which may be formed on the substrate on which the filter of FIG. 7 is formed. The electronic circuit providing the signal to be filtered may also be formed on this substrate.

Figure 8:
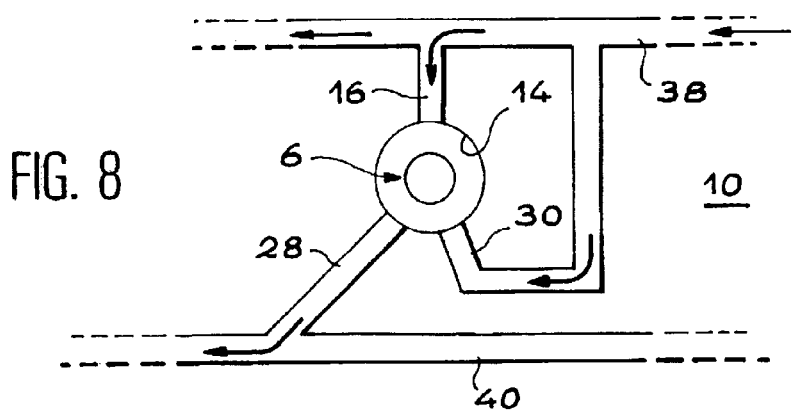
FIG. 8 is a schematic and partial top view of an alternative embodiment of the filters of FIGS. 6 and 7.

A closed loop control may be provided for the filters of FIGS. 6 and 7. As shown in FIG. 8, to do this, it is sufficient that each elementary filter 36 have two output electrodes 28 and 30 instead of a single one, the output electrode 28 being connected to the output strip 40, while the other output electrode 30 forms a loop to be connected to the input strip 38 (and therefore to the input electrode 16).

In a specific embodiment of the invention, the metallization of the microtips and of the associated nanobeams is performed by means of a layer 9 of a magnetic metal (FIG. 5), for example, an iron-nickel alloy. In this case, the substrate bearing this filter is placed in an intense magnetic field during the manufacture of the filter, to magnetize the metallization layer 9.

In this specific embodiment, there is no need to polarize this metallization layer 9.

It is specified that the magnetic field H (FIG. 5) generated by the thereby magnetized metallization layer 9 is substantially perpendicular to the plane of the substrate 2, as seen in FIG. 5.

Reference is made to the following document:

Géradin, M., Rixen, D., Théorie des vibrations [Theory of Vibrations], publishers: Masson (1993).

According to this document, it is possible to analytically calculate the resonant frequency F of a nanostructure in the form of a beam, energized in vacuo, i.e. neglecting damping due to the air, which corresponds to a encapsulated vacuum nanoresonator.

For example, this resonant frequency may be calculated in the case (A) when the beam-shaped nanostructure has a length l of 100 nanometers and a diameter d of 30 nanometers, or in the case (B) when this length is 100 nanometers and the corresponding diameter is 30 nanometers.

The equation for calculating the resonant frequency is the following:

$$(2\pi F)^2 = \omega^2 = \mu^4 \frac{EI}{Ml^4} \quad \text{with} \quad I = \frac{\pi d^4}{64}$$

In this equation, E represents the Young's modulus expressed in Pa, M represents the mass per unit length, expressed in kg/m, and I is the quadratic moment of the nanotip expressed in $m^4$.

In both cases above, for a silicon nanobeam, E is $1.9 \times 10^{11}$ Pa, M is $1.626 \times 10^{-12}$ kg/m and I is $3.976 \times 10^{-32}$ $m^4$.

The coefficient $\mu$ depends on the mode of vibration. In the case of the first mode of vibration, which is a bending mode, $\mu$ is 1.875.

In the case (A), the resonant frequency is $1.206 \times 10^{13}$ Hz, and, in the case (B), this frequency is $4.238 \times 10^8$ Hz. It is seen that in the most unfavorable case and for the first mode of vibration, the resonant frequency is higher than 400 MHz and therefore higher than those provided by the prior art.

In the examples of the invention which have been given, the microtips and the nanobeams were made electrically conductive by forming a metallization layer on the substrate, the microtips and the nanobeams.

One would not depart from the scope of the invention by forming conductive microtips, for example, by strongly doping the silicon, on a substrate made insulating, for example, by a layer of insulating oxide (how to do such a thing is well known, particularly for manufacturing screens with microtips), and by then forming nanobeams on the apex of the microtips by reactive ion etching. It is then no longer necessary to metallize the microtips and nanobeams.

What is claimed is:

1. Electromechanical filter, comprising:

a substrate;

at least one microtip formed on the substrate and an apex of the microtip extending by a nanostructure in a form of a beam that extends along an axis of the microtip, the microtip and the nanostructure being, at least superficially, electrically conductive, the nanostructure forming a resonator;

an electrically insulating layer formed on the substrate and including a cavity in which the microtip is located and, substantially at a level of the apex of the microtip, a bore that extends the cavity, an edge of the bore surrounding the apex; and at least one input electrode and at least one output electrode formed on the insulating layer and that end substantially at the edge of the bore, on both sides of the microtip, the input electrode configured to receive an electrical signal to be filtered and the output electrode configured to supply a filtered electrical signal, a coupling being created between the input and output electrodes and the nanostructure, the coupling enabling the resonator to be set in resonance.

2. Filter according to claim 1, wherein the microtip and the nanostructure are metallized.

3. Filter according to claim 1, wherein the microtip is associated with two output electrodes, one of which is electrically connected to the input electrode.

4. Filter according to claim 1, wherein the microtip and the nanostructure are coated with a layer of a magnetic metal, configured to produce a magnetic field substantially parallel to the axis of the microtip.

5. Filter according to claim 1, comprising plural mictrotips, provided with input electrodes, output electrodes, and nanostructures respectively, which form resonators having a same resonant frequency, the input electrodes being electrically connected to each other and the output electrodes being electrically connected to each other.

6. Filter according to claim 1, comprising plural microtips, provided with input electrodes, output electrodes, and nanostructures, respectively, which form resonators, the microtips being distributed into a plurality of groups, the resonators associated with the microtips of a same group having a same resonant frequency, the input electrodes being electrically connected to each other and the output electrodes associated with the microtips of the same group being electrically connected to each other.

7. Filter according to claim 1, wherein each electromechanical resonator is in a space in which a vacuum has been applied.

* * * * *